United States Patent
Jiang et al.

[11] Patent Number: 5,886,972
[45] Date of Patent: Mar. 23, 1999

[54] RECORDING INFORMATION IN A PHASE CHANGE OPTICAL MEDIUM WITH A VERTICAL CAVITY SURFACE EMITTING LASER

[75] Inventors: Wenbin Jiang, Phoenix; Michael S. Lebby, Apache Junction, both of Ariz.

[73] Assignee: Motorola, Schaumburg, Ill.

[21] Appl. No.: 582,244

[22] Filed: Jan. 3, 1996

[51] Int. Cl.$^6$ ................................ H01S 3/19; G11B 7/00
[52] U.S. Cl. ........................... 369/116; 369/122; 372/45; 372/96
[58] Field of Search ................. 369/166, 275.1, 369/112, 122, 54, 275.2, 288; 372/45, 46, 50, 92, 98, 96, 22, 19

[56] References Cited

U.S. PATENT DOCUMENTS

| | | | |
|---|---|---|---|
| 5,345,462 | 9/1994 | Choquette | 372/45 |
| 5,412,680 | 5/1995 | Swirhun et al. | 372/96 |
| 5,483,511 | 1/1996 | Jewell et al. | 369/112 |
| 5,539,759 | 7/1996 | Chang-Hasnian et al. | 372/19 |
| 5,544,137 | 8/1996 | Ohara et al. | 369/54 |

*Primary Examiner*—Georgia Y. Epps
*Assistant Examiner*—Kim-Kwok Chu
*Attorney, Agent, or Firm*—Eugene A. Parsons

[57] ABSTRACT

An apparatus for changing the phase of an optical storage medium changeable between a reflective phase and a dispersive phase. The apparatus including a quasi-multimode vertical cavity surface emitting laser constructed to provide a laser beam in a square shaped mode, to be directed onto the storage medium.

18 Claims, 1 Drawing Sheet

RECORDING INFORMATION IN A PHASE CHANGE OPTICAL MEDIUM WITH A VERTICAL CAVITY SURFACE EMITTING LASER

FIELD OF THE INVENTION

This invention relates to data storage and recovery devices.

More particularly, the present invention relates to optical data storage and recovery devices.

In a further and more specific aspect, the instant invention concerns laser access and writing of optical data.

BACKGROUND OF THE INVENTION

Optically reproducing pick-up heads for reading information stored on a storage medium, such as a compact disk, are well know. Unfortunately, while they are sufficient for reading data, they cannot write data to the storage medium.

Recent developments in phase changing materials have opened up the possibility of read/write optical devices. The materials developed change between two phases, one more reflective than the other. This permits data to be stored digitally and recovered in a manner similar to the current method of scanning pits and lands.

In conventional read systems, light is projected onto the surface of a data storage medium containing pits and lands. The changes in light intensity through the conductivity mechanism of a light receiving assembly informs the system of a transition from a pit to a land and vice-versa. In operation, the pits scatter the light, and the lands reflect the light. These changes are detected by the optical device and register in a digital form. By using phase changing materials, the material can be written to by changing portions between phases. The different phases function in a manner similar to pits and lands, with one phase scattering the light and the other reflecting it. Attempts at producing optical write devices include providing phase change materials which change between phases by the application of heat. Heat is supplied by energy from the beams of edge emitting lasers. While multi-spacial mode edge emitting diode lasers provide a sufficiently powerful laser beam, the intrinsically severe astigmatism, mode partition, and mode hopping noise make it unsuitable for optical writing. The severe astigmatism makes it difficult to focus the laser beam down to an appropriate spot size and makes it difficult to provide uniform energy distribution for changing the material's phase. Mode partition and hopping noise further effect the quality of data recording.

It would be highly advantageous, therefore, to remedy the foregoing and other deficiencies inherent in the prior art.

Accordingly, it is an object of the present invention to provide new and improved optical data read/write apparatus.

Another object of the invention is to provide compact optical data read/write apparatus.

And another object of the invention is to provide an optical data read/write device employing a relatively high powered VCSEL.

Still another object of the present invention is to provide a optical data read/write device which will produce a more efficient phase change.

Yet another object of the invention is to provide an optical data read/write device with a lower cost due to simplified device fabrication processes.

SUMMARY OF THE INVENTION

Briefly, to achieve the desired objects of the instant invention in accordance with a preferred embodiment thereof, provided is an apparatus for changing the phase of an optical storage medium including a quasi-multimode vertical cavity surface emitting laser constructed to provide a laser beam in a square or donut shaped mode, to be directed onto the storage medium.

Further provided is an embodiment employing a quasi-multimode vertical cavity surface emitting laser having an output greater than 10 mw, an output area in a range of 10–20 microns in diameter, and includes more than 1 and less than 5 modes.

In a further embodiment focusing means is included for focusing the beam down to a one micron spot size directed onto the storage medium.

Yet another embodiment provides an optical data storage read/write system including a storage medium changeable between a reflective phase and a dispersive phase, and an array of quasi-multimode vertical cavity surface emitting lasers for emitting parallel laser beams directed onto different tracts of the storage medium for changing the storage medium between the reflective phase and the dispersive phase.

Also provided is a method of storing data on an optical storage medium including the steps of providing an optical storage medium changeable between a reflective phase and a dispersive phase, providing a quasi-multimode vertical cavity surface emitting laser, generating a laser beam from the quasi-multimode vertical cavity surface emitting laser, and directing the laser beam onto the optical storage medium to change the storage medium from one phase to the other.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE PREFERRED EMBODIMENTS

Figure 1:
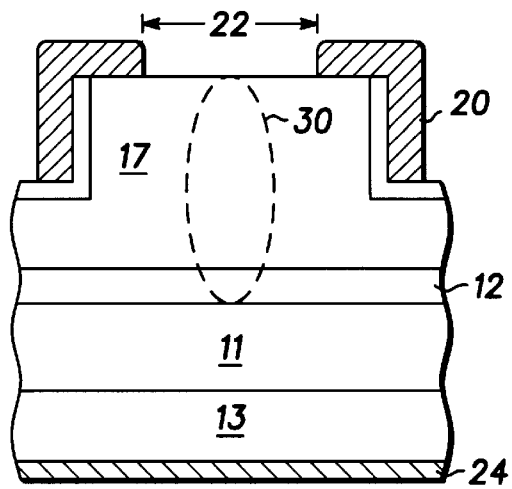
FIG. 1 is a cross-sectional view of a quasi-multimode vertical cavity surface emitting laser.

Turning now to the drawings in which like reference characters indicate corresponding elements throughout the several views, attention is first directed to FIG. 1 which illustrates a vertical cavity surface emitting laser (VCSEL) having quasi-multimodes and generally designated 10. Quasi-multimode VCSEL 10 includes a substrate 13 on which a first mirror stack 11, an active region 12, which may include such layers as cladding layers and quantum wells and the like, and a second mirror stack 17 are deposited, respectively. Second mirror stack 17 is etched, or selectively deposited, to form a mesa-like structure. An electrical contact 20 is formed in contact with at least the upper end of second mirror stack 17. Electrical contact 20 defines a window 22 for the emission of light from Quasi-multimode VCSEL 10 after passing through second mirror stack 17. A second electrical contact 24 is positioned over the lower surface of substrate 13.

An operating voltage applied across contacts 20 and 24 produces a current flow through Quasi-multimode VCSEL 10 which produces the lasing action as is well known. In general, because of the position of electrical contact 20 on the surface of second mirror stack 17, current flows throughout the mesa-like structure of second mirror stack 17 and lasing is supported wherever current flows. In many uses, a single mode is desired. To achieve a single mode, current flow is often restricted to closely match a single optical mode or lasing area designated by broken line 30. Current outside single optical mode 30 produces additional modes. Typically, the diametric size of the mesa is dependent upon the mode of operation of the VCSEL, with the diameter closely matching the mode of operation. In this manner, current flow is generally limited to a single mode of operation.

VCSEL 10 of the present invention, is a quasi-multimode VCSEL, meaning that it emits light in preferably more than 1 mode and less than 5 modes. Therefore, as is illustrated, the mesa like structure is larger than single optical mode 30. The large size permits a correspondingly large window 22, permitting an emission of a quasi-multimode laser beam having an output area with a diameter of approximately 10 microns to 20 microns.

Figure 2:
FIG. 2 is a diagram illustrating the shape of the spacial mode.

With additional reference to FIG. 2, the spatial mode is preferably a square shape or square shape with a little dip in the center, referred to as a donut shape 32, as illustrated. For purposes of this disclosure, both the square shape and the square shape with a dip will hereinafter be referred to as a square shaped mode. Single mode VCSELs produce a single Gaussian shape which peaks, delivering an energy gradient increasing toward the center. By utilizing a quasi-multimode VCSEL, a square shape is achieved, providing uniformly distributed energy. Furthermore, a quasi-multimode VCSEL produces a beam more powerful than a single mode VCSEL can achieve, due to its size, greater current carrying capacity, and larger output area.

Figure 3:
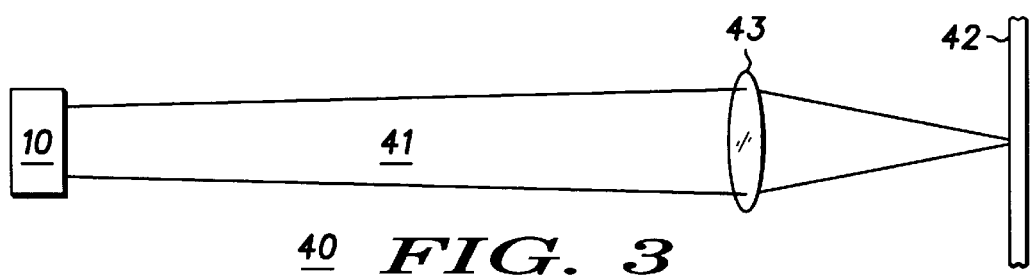
FIG. 3 is a schematic diagram of an optical data read/write system constructed in accordance with the teachings of the present invention.

Turning now to FIG. 3, an optical data write system generally designated 40 is illustrated. System 40 includes quasi-multimode VCSEL 10 which generates a laser beam 41 directed along a path onto the surface of a storage medium 42. Storage medium 42 is formed from a phase change material capable of changing between an amorphous state and a crystalline state upon the application of heat. The amorphous state, also referred to as the dispersive phase has a lower reflectance than the crystalline state, also referred to as the reflective phase. In the phase change materials now developed, the reflectance of the material ranges from approximately 10%–35% for the amorphous state and approximately 20%–60% for the crystalline state, dependent upon the laser energy provided. Generally greater than 10 mw of energy is required to adequately change the material's phase, and greater than 20 mw is preferred.

It is anticipated that phase change materials will be available in the near future which will adequately change phases upon the application of much lower energy, such as 1 to 5 mw. Quasi-multimode VCSEL 10 is perfectly adapted for use with this material as it operates very efficiently at the lower current levels required to produce 1 to 5 mw and still provides the square shaped mode.

To provide sufficient storage capacity and for reasons of sensing capabilities, it has been found to be desirable for laser beam 41 to be focused to a 1 micron spot size on storage medium 42. This tightening of the beam also concentrates the energy, thereby providing sufficient energy to change a 1 micron spot of phase change material. The VCSELs herein described emit a substantially perfectly round beam having no astigmatism, and are thus easily focused to a 1 micron spot size. To focus the beam, a lens focusing system (herein represented by a single focus lens 43) is employed along the path of the beam between quasi-multimode VCSEL 10 and storage medium 42. Due to the quasi-multimode nature of VCSEL 10, laser beam energy is generally evenly distributed across the 1 micron spot, providing an efficient and uniform phase change in the material.

Data reading has not been specifically addressed as it is disclosed in co-pending patent applications. However it will be understood that in some applications VCSEL 10 may be reduced in power to act as the light source when reading the storage media is desired. Alternatively, use of VCSEL 10 in an optical reading/write head may produce a read and erase system.

A further embodiment (not shown) employs an array of VCSELs emitting a plurality of beams wherein a single beam is achieved by optically converging the plurality of beams or employing a phase shift array. Such a VCSEL array can be used to produce a beam of sufficient energy to produce an efficient phase change in the phase change material at the higher end of the reflectance range.

Figure 4:
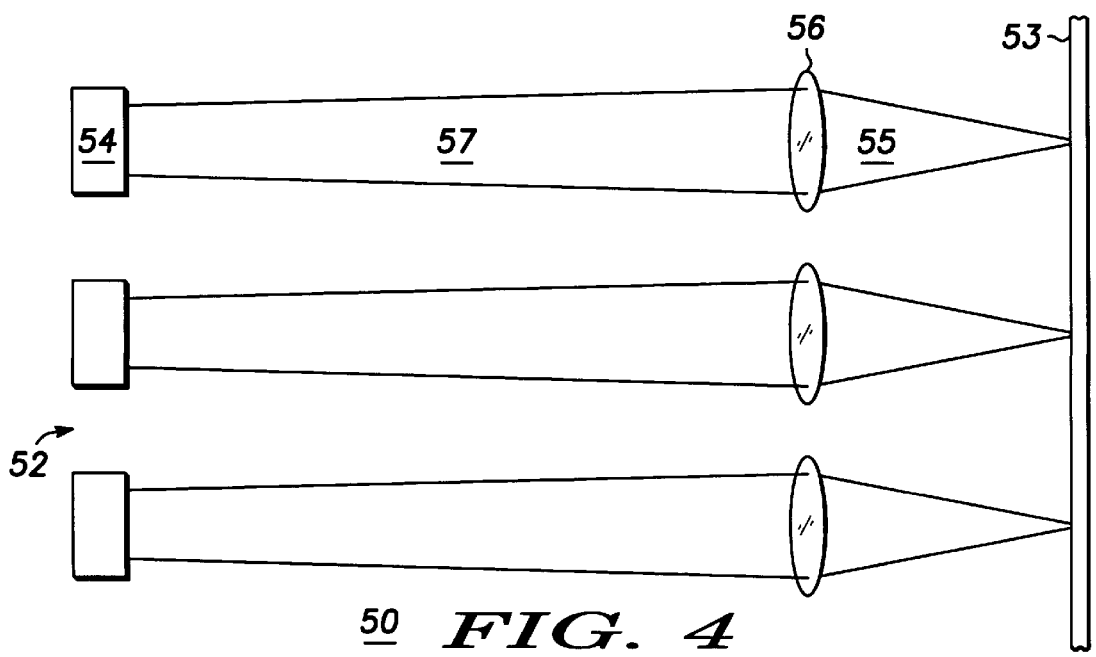
FIG. 4 is a schematic diagram of a parallel optical data read/write system.

Referring to FIG. 4, a parallel read/write optical data system generally designated 50 is illustrated. System 50 includes a parallel read/write head 52 and a storage medium 53 formed of a phase change material as described previously. Head 52 includes an array of quasi-multimode VCSELs 54, generally identical to quasi-multimode VCSEL 10 described previously, each emitting a laser beam 55 and having an output area with a diameter of approximately 10–20 microns. Beams 55 are parallel, are each focused into a spot having a diameter of approximately 1 micron, and are directed onto different tracts of storage medium 53. To focus beams 55, focus systems (represented by single lenses 56) are employed along the path of each beam 55 between quasi-multimode VCSELs 54 and storage medium 53. The focused beams will change the phase change material of storage medium 53 as required. Beams 55 may be directed through lenses 56 by free space, or directed by waveguides 57 as illustrated.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same,

The invention claimed is:

1. An apparatus for changing the phase of an optical storage medium including a quasi-multimode vertical cavity surface emitting laser constructed to provide a laser beam in a square shaped mode, to be directed onto the storage medium.

2. An apparatus as claimed in claim 1 wherein the quasi-multimode vertical cavity surface emitting laser has an output greater than 1 mw.

3. An apparatus as claimed in claim 2 wherein the quasi-multimode vertical cavity surface emitting laser has an output greater than 10 mw.

4. An apparatus as claimed in claim 2 wherein the quasi-multimode vertical cavity surface emitting laser includes an output area in a range of 10–20 microns in diameter.

5. An apparatus as claimed in claim 1 wherein the quasi-multimode vertical cavity surface emitting laser includes more than 1 and less than 5 modes.

6. An apparatus as claimed in claim 1 further including focusing means for focusing the beam down to a one micron spot size directed onto the storage medium.

7. An apparatus as claimed in claim 6 wherein the focusing means includes a focal lens.

8. An optical data storage read/write system comprising:
   a storage medium changeable between a reflective phase and a dispersive phase; and
   a quasi-multimode vertical cavity surface emitting laser which produces a laser beam directed onto the storage medium for changing the storage medium between the reflective phase and the dispersive phase.

9. A system as claimed in claim 8 wherein the storage medium changes phase at greater than 10 mw and the quasi-multimode vertical cavity surface emitting laser has an output greater than 10 mw.

10. A system as claimed in claim 9 wherein the quasi-multimode vertical cavity surface emitting laser includes an output area in a range 10–20 microns in diameter.

11. A system as claimed in claim 10 wherein the quasi-multimode vertical cavity surface emitting laser includes more than 1 and less than 5 modes.

12. A system as claimed in claim 11 further including focusing means for focusing the beam down to a one micron spot size directed onto the storage medium.

13. A system as claimed in claim 12 wherein the focusing means includes a focal lens.

14. A system as claimed in claim 12 wherein the quasi-multimode vertical cavity surface emitting laser is included in an array of quasi-multimode vertical cavity surface emitting lasers for emitting parallel laser beams directed onto different tracts of the storage medium for changing the storage medium between the reflective phase and the dispersive phase.

15. A system as claimed in claim 14 wherein each of the quasi-multimode vertical cavity surface emitting lasers of the array has an output greater than 10 mw, an output area in a range of 10–20 microns in diameter, and includes more than 1 and less than 5 modes.

16. A method of storing data on an optical storage medium including the steps of:
   providing an optical storage medium changeable between a reflective phase and a dispersive phase;
   providing a quasi-multimode vertical cavity surface emitting laser;
   generating a laser beam from the quasi-multimode vertical cavity surface emitting laser; and
   directing the laser beam onto the optical storage medium to change the storage medium from one phase to the other.

17. A method as claimed in claim 16 wherein the step of generating a laser beam includes generating a laser beam of greater than 10 mw, having an output area in a range of 10–20 microns in diameter, and includes more than 1 and less than 5 modes.

18. A method as claimed in claim 17 wherein the step of directing the laser beam includes focusing the laser beam down to a one micron spot size directed onto the storage medium.

\* \* \* \* \*